| United States Patent [19] | [11] | 4,188,224 |
|---|---|---|
| Felder et al. | [45] | Feb. 12, 1980 |

[54] PHOTOPOLYMERIZABLE COMPOSITION CONTAINING ANTHRONES

[75] Inventors: Louis Felder, Basel; Rudolf Kirchmayr, Aesch, both of Switzerland

[73] Assignee: Ciba-Geigy Corporation, Ardsley, N.Y.

[21] Appl. No.: 892,568

[22] Filed: Apr. 3, 1978

Related U.S. Application Data

[63] Continuation of Ser. No. 768,243, Feb. 14, 1977, abandoned.

[30] Foreign Application Priority Data

Feb. 23, 1976 [CH] Switzerland .......................... 2173/76

[51] Int. Cl.$^2$ ................................................ G03C 1/68
[52] U.S. Cl. ........................... 204/159.15; 204/159.18; 204/159.23; 204/159.24; 106/19; 430/923
[58] Field of Search .......................... 96/115 R, 115 P; 204/159.18, 159.23, 159.26, 159.15; 106/19

[56] References Cited

U.S. PATENT DOCUMENTS

| 2,951,758 | 9/1960 | Notley | 96/115 P |
|---|---|---|---|
| 3,582,487 | 6/1971 | Fuhr et al. | 204/159.15 |
| 3,627,656 | 12/1971 | Miller et al. | 96/115 P |
| 3,787,212 | 1/1974 | Heimsch et al. | 96/115 P |
| 3,827,957 | 8/1974 | McGinniss | 96/115 P |
| 3,857,769 | 12/1974 | McGinnis | 96/115 P |

*Primary Examiner*—Jack P. Brammer
*Attorney, Agent, or Firm*—Luther A. R. Hall

[57] ABSTRACT

Anthrone derivatives having hydroxy, ether or hydrocarbyl groups in 10-position, for example 10,10-dimethoxyanthrone, are excellent photoinitiators for the UV-curing of unsaturated systems. Preferable systems are monomeric or oligomeric acrylates and their mixtures.

The systems may be used in thin layers as for instance for coatings or printing inks.

6 Claims, No Drawings

PHOTOPOLYMERIZABLE COMPOSITION CONTAINING ANTHRONES

This is a continuation of application Ser. No. 768,243 filed on Feb. 14, 1977, now abandoned.

The invention relates to the use of anthrone derivatives as initiators for the photopolymerisation of unsaturated compounds and to photopolymerisable systems containing such anthrone derivatives. The proposed anthrone derivatives are derivatives of 10-mono- or -di-hydroxyanthrone.

Photochemical polymerisation processes have achieved considerable importance industrially, above all in those cases where thin layers have to be cured within a short time, such as, for example, when curing lacquer coatings or when drying printing inks. Compared with conventional curing processes, UV irradiation in the presence of photoinitiators has a number of advantages, the most important of which is probably the high rate of photo-curing. The rate is highly dependent on the photoinitiator used and there has been no lack of attempts to replace the conventional initiators by ever better and more effective compounds. The most effective photoinitiators include derivatives of benzoin, above all benzoin ethers such as are described, for example, in British Pat. Nos. 1,254,231 and 1,156,460 or in Swiss Pat. No. 511,902.

Anthraquinone and its 1- and 2-halogeno derivatives or alkyl derivatives, as well as naphthoquinone or phenanthrenequinone, are also known as initiators for photopolymerisation, for example from U.S. Pat. No. 2,951,758 or Swiss Pat. No. 373,260.

Disadvantages to which these known photoinitiators are subject include, in some cases, inadequate stability of photopolymerisable systems mixed with such initiators to storage in the dark. Some benzoin derivatives tend to produce yellowing in the cured compositions. Other initiators possess inadequate reactivity, which manifests itself in relatively long curing times, or they are not sufficiently soluble in the photopolymerisable systems or they are rapidly deactivated by atmospheric oxygen. There is, therefore, a need in industry for photoinitiators which are readily soluble in the substrate and, whilst they have good stability to storage in the dark, initiate photopolymerisation more rapidly and give a higher polymer yield per unit time than the known photoinitiators. The use of such improved photoinitiators would enable better utilisation of the expensive industrial UV irradiation units.

It has been found that compounds of the formula I, which is given below, possess the required properties as photoinitiators and above all react very rapidly and do not have the disadvantages described or have the disadvantages to a substantially lesser extent than the known photoinitiators. The invention relates to the use of compounds of the formula I

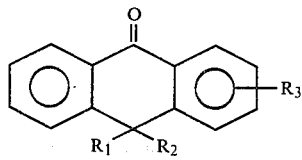

(I)

in which either $R_1$ denotes hydrogen, alkyl with 1-4 C atoms, alkoxyalkyl with 3-6 C atoms, alkenyl with 3-5 C atoms, phenyl, phenylalkyl with 7-9 C atoms, alkoxy with 1-4 C atoms, alkoxyalkoxy with 3-6 C atoms, alkylthioalkoxy with 3-6 C atoms, alkenyloxy with 3-5 C atoms, phenoxy or phenoxyalkoxy with 7-9 C atoms and $R_2$ denotes alkoxy with 1-4 C atoms, alkoxyalkoxy with 3-6 C atoms, alkylthioalkoxy with 3-6 C atoms, alkenyloxy with 3-5 C atoms, phenoxy or phenylalkoxy with 7-9 C atoms or $R_1$ denotes hydroxyl and $R_2$ denotes alkyl with 1-4 C atoms, alkoxyalkyl with 3-6 C atoms, alkenyl with 3-5 C atoms, phenyl or phenylalkyl with 7-9 C atoms or $R_1$ and $R_2$ conjointly denote $-O-(CH_2)_n-O-$ in which n represents 2, 3 or 4, and $R_3$ denotes hydrogen, halogen, alkyl with 1-4 C atoms, alkoxy with 1-4 C atoms, acylamino with 2-5 C atoms, alkylamino with 1-4 C atoms or dialkylamino with 2-8 C atoms, as photoinitiators for the photopolymerisation of unsaturated compounds.

These compounds are, thus, derivatives of 10-monohydroxy- or 10-dihydroxy-anthrone. In these compounds $R_1$, $R_2$ and $R_3$ can represent an alkyl group which can be unbranched or branched, for example methyl, ethyl, propyl, isopropyl or tert.-butyl. $R_1$ and $R_2$ can be alkoxyalkyl, for example 2-methoxyethyl, 3-methoxypropyl or 2-butoxyethyl. $R_1$ and $R_2$ can be alkenyl, for example allyl or methallyl. When $R_1$ or $R_2$ denotes phenylalkyl, the latter can be, for example, benzyl or phenylethyl. In the meaning of alkoxy, $R_1$, $R_2$ or $R_3$ can be, for example, methoxy, ethoxy or butoxy. In the meaning of alkoxyalkoxy or alkylthioalkoxy, $R_1$ or $R_2$ can be, for example, 2-methoxyethoxy, 3-ethoxypropoxy, 2-butoxyethoxy, 2-tert.-butylthioethoxy or 4-methylthiobutoxy. In the meaning of alkenyloxy, $R_1$ or $R_2$ can be, for example, allyloxy or but-2-enyloxy. In the meaning of phenoxyalkoxy, $R_1$ or $R_2$ can denote, for example, 2-phenoxyethoxy or 2-phenoxypropoxy.

When $R_3$ denotes acylamino, alkylamino or dialkylamino, this can be, for example, acetylamino, propionylamino, ethylamino, tert.-butylamino, dimethylamino or diethylamino.

The substituent $R_3$ can be in the 1-, 2- or 3-position.

Examples of compounds of the formula I which can be used according to the invention are: 10-methoxyanthrone, 10-butoxyanthrone, 10-methyl-10-methoxyanthrone, 10-ethyl-10-methoxyanthrone, 10-phenyl-10-methoxyanthrone, 10-benzyl-10-methoxyanthrone, 10-methyl-10-allyloxyanthrone, 10-methyl-10-β-methoxyethoxyanthrone, 10-allyloxyanthrone, 10-β-methoxyethoxyanthrone, 10-benzyloxyanthrone, 10-phenoxyanthrone, 10-β-methylthioethoxyanthrone, 10,10-dimethoxyanthrone, 10,10-diethoxyanthrone, 10,10-dipropoxyanthrone, 10,10-dibutoxyanthrone, 10-methoxy-10-ethoxyanthrone, 10,10-dibenzyloxyanthrone, 10,10-diphenoxyanthrone, 10,10-diallyloxyanthrone, 10,10-di-β-methylthioethoxyanthrone, 10-propyl-10-ethoxyanthrone, 10,10-ethylenedioxyanthrone, 10,10-propylenedioxyanthrone, 10,10-butylenedioxyanthrone, 1-chloro-10-methoxyanthrone, 2-chloro-10-methoxyanthrone, 3-chloro-10-methoxyanthrone, 2-bromo-10-methoxyanthrone, 1-methyl-10-methoxyanthrone, 1-tert.-butyl-10-methoxyanthrone, 1,10-dimethoxyanthrone, 1-ethoxy-10-methoxyanthrone, 1-acetylamino-10-methoxyanthrone, 1-dialkylamino-10-methoxyanthrone, 1-chloro-10,10-dimethoxyanthrone, 2-chloro-10,10-dimethoxyanthrone, 1-methyl-10,10-dimethoxyanthrone, 1-methyl-10,10-diethoxyanthrone, 10-hydroxy-10-methylanthrone, 10-hydroxy-10-ethylanthrone, 10-hydroxy-10-propylanthrone, 10-hydroxy-10-n-butylanthrone, 10-hydroxy-10-isobutylanthrone, 10-hydroxy-10-phenylanthrone, 10-hydroxy-10-allylanthrone, 10-hydroxy-10-benzylanthrone and 2-chloro-10-hydroxy-10-methylanthrone.

Those compounds of the formula I in which $R_1$ denotes hydrogen, alkyl with 1-4 C atoms or alkoxy with 1-4 C atoms, $R_2$ denotes alkoxy with 1-4 C atoms and $R_3$ denotes hydrogen, halogen, alkyl with 1-4 C atoms or alkoxy with 1-4 C atoms are preferably used.

The use of compounds of the formula I in which $R_1$ and $R_2$ denote alkoxy with 1-4 C atoms, preferably methoxy, and $R_3$ denotes hydrogen, chlorine or methyl, but preferably hydrogen, is particularly preferred. These last-mentioned compounds are monoketals of anthraquinone.

Some of the compounds comprised by the formula I are known and their manufacture has been described. Where the compounds are new, they can be manufactured analogously to the known compounds.

Thus, the compounds of the formula I in which $R_2$ represents an ether radical and $R_1$ is hydrogen or is identical to $R_2$ can be manufactured from anthrone by monohalogenation or dihalogenation in the 10-position and subsequent reaction with the corresponding hydroxy compound $R_2OH$, or an alkali metal compound thereof, as is described for the case of the monomethoxy compound in J. Chem. Soc. 1931, 3340 and for the case of the dimethoxy compound in Liebigs Ann. 396 (1913), 180.

Compounds of the formula I in which $R_1$ is hydroxyl and $R_2$ is a hydrocarbon radical can be manufactured from anthraquinone by a Grignard reaction and can optionally be converted into the compounds in which $R_2$ represents an ether group and $R_1$ represents a hydrocarbon radical by an etherification by customary methods, as is described for the corresponding methyl compounds in Bull. Soc. Chim. France 1974, 288.

In order to obtain compounds of the formula I in which $R_3$ is not hydrogen, the abovementioned reactions are carried out with an anthrone or anthraquinone which is substituted in the benzo radical (1-, 2- or 3-position).

According to the invention, the compounds of the formula I can be used for the photopolymerisation of polymerisable unsaturated compounds or systems which contain such compounds.

Examples of such compounds are unsaturated monomers, such as esters of acrylic acid or methacrylic acid, for example methyl acrylate, ethyl acrylate, n- or tert.-butyl acrylate, isooctyl acrylate or hydroxyethyl acrylate, methyl methacrylate or ethyl methacrylate, ethylene diacrylate, neopentyl diacrylate, trimethylolpropane tris-acrylate, pentaerythritol tetraacrylate or pentaerythritol tris-acrylate; acrylonitrile, methacrylonitrile, acrylamide, methacrylamide and N-substituted (meth)acrylamides; vinyl esters, such as, for example, vinyl acetate, vinyl propionate, vinyl acrylate or vinyl succinate; other vinyl compounds, such as vinyl ether, styrene, alkylstyrenes, halogenostyrenes, divinylbenzene, vinylnaphthalene, N-vinylpyrrolidone, vinyl chloride or vinylidene chloride; and allyl compounds, such as diallyl phthalate, diallyl maleate, triallyl isocyanurate, triallyl phosphate or ethylene glycol diallyl ether, and the mixtures of such unsaturated monomers.

Further photopolymerisable compounds are unsaturated oligomers of polymers and their mixtures with unsaturated monomers. These include thermoplastic resins which contain unsaturated groups, such as fumaric acid ester or allyl groups or acrylate or methacrylate groups. In most cases, these unsaturated groups are bonded to the main chain of these linear polymers via functional groups. Mixtures of oligomers with monounsaturated and polyunsaturated monomers are of great importance. Examples of such oligomers are unsaturated polyesters, unsaturated acrylic resins, polyether acrylates and isocyanate-modified or epoxide-modified acrylate oligomers. Examples of polyunsaturated compounds are, above all, the acrylates of diols and polyols, for example hexamethylene diacrylate or pentaerythritol tetraacrylate. Acrylates, such as, for example, butyl acrylate, phenyl acrylate, benzyl acrylate, 2-ethylhexyl acrylate or 2-hydroxyethyl acrylate, are also preferred as monounsaturated monomers. The means of varying the consistency of the unpolymerised mixture and the plasticity of the polymerised resin is provided by the choice from the different representatives of the three components.

In addition to these three-component mixtures, two-component mixtures, above all, play an important part in polyester resins. In most cases, these mixtures consist of an unsaturated polyester and a vinyl compound. The unsaturated polyesters are oligomeric esterification products of at least one unsaturated dicarboxylic acid, such as, for example, maleic acid, fumaric acid or citraconic acid, and in most cases, at least one saturated dicarboxylic acid, such as, for example, phthalic acid, succinic acid, sebacic acid or isophthalic acid, with glycols, such as, for example, ethylene glycol, propane-1,2-diol, di- or tri-ethylene glycol or tetramethylene glycol, and in most cases, monocarboxylic acids and monoalcohols are also additionally used for modifications. These unsaturated polyesters are usually dissolved in a vinyl or allyl compound and styrene is preferably used for this purpose.

Photopolymerisable systems such as those used for diverse purposes, in most cases contain a number of other additives in addition to the photopolymerisable compounds and the photoinitiator. Thus, it is frequently customary to add thermal inhibitors which, above all, are intended to provide protection against premature polymerisation during the production of the systems by mixing the components. Compounds used for this purpose are, for example, hydroquinone, p-methoxyphenyl, β-naphthylamine or β-naphthols. Furthermore, small amounts of UV absorbers, such as, for example, those of the benztriazole or benzophenone type, can be added.

In addition to the photoinitiators according to the invention, other known photoinitiators can also additionally be used. The use of such a mixture of initiators can result in certain advantages, for example a synergistic action.

Copper compounds, such as copper naphthenate, copper stearate or copper octoate, phosphorus compounds, such as triphenylphosphine, tributylphosphine, triethyl phosphite, triphenyl phosphite or tribenzyl phosphate, quaternary ammonium compounds, such as tetramethylammonium chloride or trimethylbenzylammonium chloride, or hydroxylamine derivatives, such as, for example, N-diethylhydroxylamine, can be added in order to increase the stability to storage in the dark. Furthermore, the photopolymerisable systems can contain chain-propagating agents, such as, for example, N-methyl-diethanolamine, triethanolamine or cyclohexene.

In order to exclude the inhibiting action of atmospheric oxygen, paraffin or similar waxy substances are frequently added to the photo-curable systems. Because of their lack of solubility in the polymer, these substances float up at the start of the polymerisation and form a transparent surface layer which prevents the admission of air. Atmospheric oxygen can also be deactivated by introducing groups which have an antioxidant action, for example allyl groups, into the resin to be cured.

Depending on their intended use, photopolymerisable systems also contain fillers, such as silica, talc or gypsum, pigments, dyestuffs, fibres, agents which impart thixotropic properties or flow auxiliaries. Additives of this type, which are known and customary, are compatible with the photoinitiators according to the invention and do not impair their action.

Photo-curing is of great importance in the case of printing inks since the drying time of the binder is a decisive factor determining the rate at which graphic products are produced and should be of the order of size of fractions of a second. The initiators according to the invention are also very suitable for photo-curable systems for the manufacture of printing plates. In this case, mixtures of soluble linear polyamides with photopolymerisable monomers, for example acrylamides, and a photoinitiator are generally used. Films or plates made from these systems are exposed via the negative (or positive) of the print original and the uncured parts are then eluted with a solvent.

A further field of application of UV-curing is metal coating, for example when lacquer-coating sheet metal for tubes, tins or bottle closures.

Examples of the UV-curing of paper coatings are the colourless lacquer coating of labels, record sleeves or book covers.

For the indicated fields of application, the compounds of the formula I are appropriately used in amounts of 0.1 to 20% by weight, and preferably of about 0.5 to 5% by weight, relative to the photopolymerisable system. In this context, system means the mixture of the photopolymerisable compound, the photoinitiator and the other fillers and additives which is used in the particular application.

The addition of the photoinitiators to the photopolymerisable systems is generally effected by simple stirring-in since most of these systems are liquid or readily soluble. In most cases a solution of the initiators according to the invention is obtained and by this means homogeneous distribution, and transparency of the polymers, are ensured.

Polymerisation is effected by the known methods of photopolymerisation by irradiation with light which is rich in shortwave radiation. Examples of suitable sources of light are medium pressure, high pressure and low pressure mercury lamps and also superactinic fluorescent tubes which have emission maxima in the range between 300 and 400μ.

The use of the compounds of the formula I is described in more detail in the example which follows. In this example, parts denote parts by weight, percentages denote percentages by weight and the temperature is given in degrees Centigrade.

EXAMPLE 1

A resin mixture consisting of 80 parts of Plex 6617 (acrylate resin from Messrs. Röhm, Darmstadt), 20 parts of trimethylolpropane tris-acrylate and 2 parts of a photoinitiator is spread, in a thickness of 40 μm, onto glass plates using a film spreader. These films are exposed to the air for about 20 seconds and then irradiated with a medium pressure Hg burner (Hanovia-Gerät, Model 45080). During irradiation, the samples are moved on a conveyor belt under the UV lamp at a rate such that the effective exposure time is 0.16 seconds per path.

The table which follows gives the number of passes (P) which were necessary to obtain tack-free films with the photoinitiators according to the invention. The hardness of the film was also determined using a König pendulum apparatus.

Table 1

| Photoinitiator used | Necessary passes | König pendulum hardness after a given number of passes | | |
|---|---|---|---|---|
| 10,10-Dimethoxy anthrone | 4 | 44(3P) | 70(4P) | 107(6P) |
| 10,10-Diethoxy anthrone | 5 | 76(5P) | 105(7P) | 122(10P) |
| 10-Hydroxy-10-methylanthrone | 5 | 83(6P) | 102(8P) | 127(10P) |
| 10-Methoxy-10-methylanthrone | 4 | 85(4P) | 101(6P) | 115(8P) |
| 10,10-Ethylene-dioxyanthrone | 4 | 55(4P) | 66(6P) | 96(8P) |

EXAMPLE 2

The resin mixture described in Example 1, which contains 2 parts of a photoinitiator, was spread in a thickness of 40 μm onto glass plates, stored for half an hour under standard climatic conditions and then exposed to a medium pressure Hg burner (distance from the lamp 11 cm, rate of transport 20.35 m/minute). Table 2 gives the König pendulum hardness which was obtained as a function of the exposure time and gives a comparison with a film cured with benzophenone.

Table 2

| Photo-curing agent | Pendulum hardness after exposure | |
|---|---|---|
| | 0.96 second | 1.6 seconds |
| 10,10-Dimethoxyanthrone | 106 | 132 |
| Benzophenone | 54 | 72 |

EXAMPLE 3

In order to determine the surface drying, the resin composition described in Example 1 is applied in a thickness of 15 μm to special cardboard. These films are irradiated as in Example 1 and then sprinkled with talcum powder. Talcum powder which does not adhere is removed and the gloss of the films is then measured using a reflectometer. The table which follows shows the gloss values as a function of the exposure time. In this case the gloss is a measure of the rate of curing.

Table 3

| Photoinitiator | (Gloss (% reflection) | |
|---|---|---|
| | 0.16 second | 0.32 second |
| 3 parts of 10,10-dimethoxyanthrone | — | 78 |
| 5 parts of 10,10-dimethoxyanthrone | 58 | — |

EXAMPLE 4

A resin mixture consisting of 60 parts of Beckopox VEM 37/3 (epoxy acrylate from Messrs. Hoechst), 25 parts of hexanediol diacrylate, 10 parts of trimethylolpropane trisacrylate, 5 parts of N-methyldiethanolamine and 3 parts of 10,10-dimethoxyanthrone is applied to special cardboard as described in Example 3 and exposed for 0.16 second. The gloss (% reflection) of the cured film is then measured as described above. The gloss value obtained was 82%.

EXAMPLE 5

A resin mixture consisting of 80 parts of Uvimer DV 540 (urethane acrylate from Messrs. Polychrome), 15 parts of triethylene glycol diacrylate, 5 parts of N-methyldiethanolamine and 3 parts of 10,10-dimethoxyanthrone is applied to special cardboard using a hand roller. (Weight weighed out for application=4.4 g/m$^2$, which corresponds to a layer thickness of about 4μ). The exposure is carried out as described in Example 1. After an exposure time of 0.16 seconds, a gloss value of 78% is obtained.

We claim:

1. A photopolymerizable composition consisting essentially of one or more esters of acrylic acid or methacrylic acid and 0.5 to 5% by weight of a compound selected from the group consisting of 10,10-dimethoxyanthrone, 10,10-diethoxyanthrone and 10,10-ethylenedioxyanthrone.

2. Photopolymerisable composition according to claim 1 which is a photopolymerisable printing ink.

3. Photopolymerisable composition according to claim 1 which is a photopolymerisable composition for the manufacture of printing plates.

4. Photopolymerisable composition according to claim 1 which contains, as the photoinitiator, 10,10-dimethoxyanthrone.

5. Photopolymerisable composition according to claim 1 which contains, as the photoinitiator, 10,10-diethoxyanthrone.

6. Photopolymerisable composition according to claim 1 which contains, as the photoinitiator, 10,10-ethylenedioxyanthrone.

* * * * *